US008809974B2

(12) United States Patent
Lo et al.

(10) Patent No.: US 8,809,974 B2
(45) Date of Patent: Aug. 19, 2014

(54) SEMICONDUCTOR PACKAGE FOR MEMS DEVICE AND METHOD OF MANUFACTURING SAME

(75) Inventors: Chi Kwong Lo, Tsing Yi (CN); Lik Hang Wan, Fanling (HK); Ming Wa Tam, Sham Tseng (HK)

(73) Assignee: Ubotic Intellectual Property Company Limited, Tsuen Wan, New Territories (HK)

( * ) Notice: Subject to any disclaimer, the term of this patent is extended or adjusted under 35 U.S.C. 154(b) by 0 days.

(21) Appl. No.: 13/581,270

(22) PCT Filed: Feb. 26, 2010

(86) PCT No.: PCT/CN2010/070775
§ 371 (c)(1),
(2), (4) Date: Aug. 24, 2012

(87) PCT Pub. No.: WO2011/103720
PCT Pub. Date: Sep. 1, 2011

(65) Prior Publication Data
US 2012/0319256 A1    Dec. 20, 2012

(51) Int. Cl.
*H01L 29/84*    (2006.01)
(52) U.S. Cl.
USPC ............ 257/416; 257/E21.506; 257/415; 257/704; 438/50; 438/125
(58) Field of Classification Search
CPC ............................................. B81B 2201/0257
USPC .......... 257/E23.031, E21.506, 415, 416, 666, 257/659, 704, 710, 727; 438/50, 51, 55, 64, 438/123, 125
See application file for complete search history.

(56) References Cited

U.S. PATENT DOCUMENTS

| | | | | |
|---|---|---|---|---|
| 4,314,225 A * | 2/1982 | Tominaga et al. | ................ | 338/4 |
| 5,852,320 A * | 12/1998 | Ichihashi | ...................... | 257/419 |
| 6,938,490 B2 * | 9/2005 | Wagner et al. | .................. | 73/708 |
| 7,202,552 B2 * | 4/2007 | Zhe et al. | ...................... | 257/659 |
| 7,419,853 B2 | 9/2008 | Kuhmann et al. | | |
| 7,436,054 B2 * | 10/2008 | Zhe | ............... | 257/686 |
| 7,550,828 B2 * | 6/2009 | Ramakrishna et al. | ....... | 257/676 |

(Continued)

FOREIGN PATENT DOCUMENTS

| | | |
|---|---|---|
| CN | 1215919 | 5/1999 |
| CN | 1813490 | 8/2006 |

(Continued)

OTHER PUBLICATIONS

ISR and Written Opinion from corresponding Int'l Application No. PCT/CN2010/072363, 12 pages, Feb. 10, 2011.
ISR and Written Opinion from corresponding Int'l Application No. PCT/CN2010/072367, 8 pages, Feb. 10, 2011.

(Continued)

*Primary Examiner* — Chris Chu
(74) *Attorney, Agent, or Firm* — Bryan Cave LLP

(57) ABSTRACT

In some embodiments, a semiconductor package can include: (a) a base having a cavity; (b) an interposer coupled to the base and at least partially over the cavity such that the interposer and the base form a back chamber, the interposer has a first opening into the back chamber; (c) a micro-electromechanical system device located over the interposer at the first opening; and (d) a lid coupled to the base. Other embodiments also are disclosed.

28 Claims, 18 Drawing Sheets

(56) References Cited

U.S. PATENT DOCUMENTS

| | | | |
|---|---|---|---|
| 7,692,288 B2* | 4/2010 | Zhe et al. | 257/704 |
| 7,781,852 B1* | 8/2010 | Faheem et al. | 257/419 |
| 7,843,021 B2* | 11/2010 | Zhe et al. | 257/416 |
| 7,953,235 B2* | 5/2011 | Song | 381/174 |
| 2006/0081994 A1 | 4/2006 | Craig et al. | |
| 2007/0040231 A1* | 2/2007 | Harney et al. | 257/415 |
| 2007/0205492 A1* | 9/2007 | Wang | 257/659 |
| 2008/0157301 A1* | 7/2008 | Ramakrishna et al. | 257/676 |
| 2008/0166000 A1 | 7/2008 | Hsiao | |
| 2008/0298621 A1 | 12/2008 | Theuss et al. | |
| 2009/0001553 A1* | 1/2009 | Pahl et al. | 257/704 |
| 2009/0080682 A1* | 3/2009 | Ogura et al. | 381/355 |
| 2013/0128487 A1 | 5/2013 | Lo et al. | |

FOREIGN PATENT DOCUMENTS

| | | |
|---|---|---|
| CN | 2812465 | 8/2006 |
| CN | 2870352 | 2/2007 |
| CN | 101282594 | 10/2008 |
| CN | 101296530 | 10/2008 |
| CN | 101394687 | 3/2009 |
| CN | 101415138 | 4/2009 |
| CN | 101492148 | 7/2009 |
| CN | 201426177 | 3/2010 |
| JP | 2007-178133 | 7/2007 |

OTHER PUBLICATIONS

International Search Report and Written Opinion from corresponding International Application No. PCT/CN10/070775 dated Dec. 2, 2010.

* cited by examiner

US 8,809,974 B2

SEMICONDUCTOR PACKAGE FOR MEMS DEVICE AND METHOD OF MANUFACTURING SAME

CROSS-REFERENCE TO RELATED APPLICATIONS

This application is a national stage application under 35 U.S.C. 371 of and claims priority to International Application No. PCT/CN10/070775 filed Feb. 26, 2010. International Application No. PCT/CN10/070775 is incorporated herein by reference.

FIELD OF THE INVENTION

This invention relates generally to semiconductor packaging, and relates more particularly to packaging for micro-electro-mechanical system (MEMS) devices and methods of manufacturing the same.

DESCRIPTION OF THE BACKGROUND

Semiconductor devices are conventionally enclosed in plastic or ceramic packages that provide protection from hostile environments and enable electrical connections between elements of the integrated circuit.

Certain semiconductor devices present unique packaging needs, such as air cavity packages that need sound or air to enter the semiconductor package for the enclosed semiconductor device to function properly. One example of a semiconductor device using an air cavity package is a micro-electro-mechanical system (MEMS) microphone. Other MEMS devices also can use similar air cavity packages.

Recently, the demand for MEMS microphones has increased because of the increased demand for cellular telephones and the incorporation of MEMS microphones in more portable audio devices and digital camera and video products.

Accordingly, a need or potential for benefit exists for an improved semiconductor or air cavity package for MEMS devices.

BRIEF DESCRIPTION OF THE DRAWINGS

To facilitate further description of the embodiments, the following drawings are provided in which.

Figure 1:
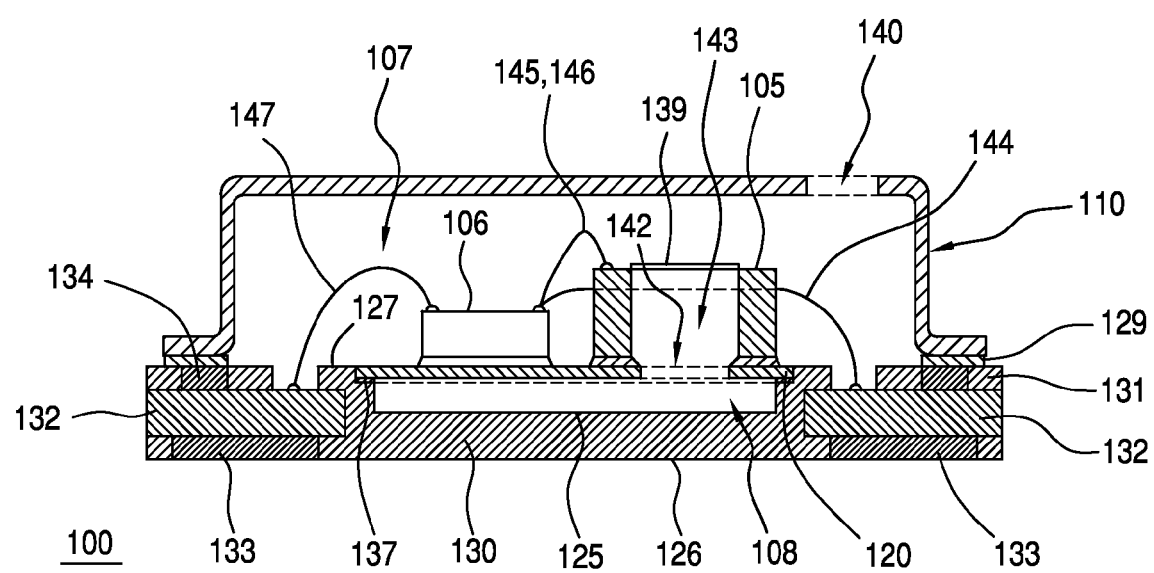
FIG. 1 illustrates a cross-sectional view of an example of a semiconductor package along the I-I line (FIG. 2), according to a first embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "coupled," and the like does not mean that the coupling, etc. in question is or is not removable.

DETAILED DESCRIPTION OF EXAMPLES OF EMBODIMENTS

In some embodiments, a semiconductor package can include: (a) a base having a cavity; (b) an interposer coupled to the base and at least partially over the cavity such that the interposer and the base form a back chamber, the interposer has a first opening into the back chamber; (c) a micro-electro-mechanical system device located over the interposer and the first opening; and (d) a lid coupled to the base.

In other embodiments, an air cavity package can include: (a) a substrate with: (1) a leadframe with one or more leads; and (2) a plastic material with a cavity and at least partially surrounding the one or more leads; (b) a metal interposer with a first opening and coupled to the substrate such that the metal interposer provides a top for the cavity and such that the metal interposer and the plastic material form a first interior space; (c) a micro-electro-mechanical system microphone at least partially located over the first aperture in the metal interposer; (d) one or more semiconductor devices located over the metal interposer; and (e) a lid electrically coupled to a first one of the one or more leads and mechanically coupled to the substrate.

Further embodiments can disclose a method of manufacturing a semiconductor package. The method can include: providing a leadframe; providing a non-electrically conductive material around the leadframe to form a base; providing an interposer with an opening; coupling the interposer to the base such that the interposer and the base form a back chamber; providing at least one micro-electro-mechanical system device; and coupling the at least one micro-electro-mechanical system device to the interposer at least partially over the opening.

Figure 2:
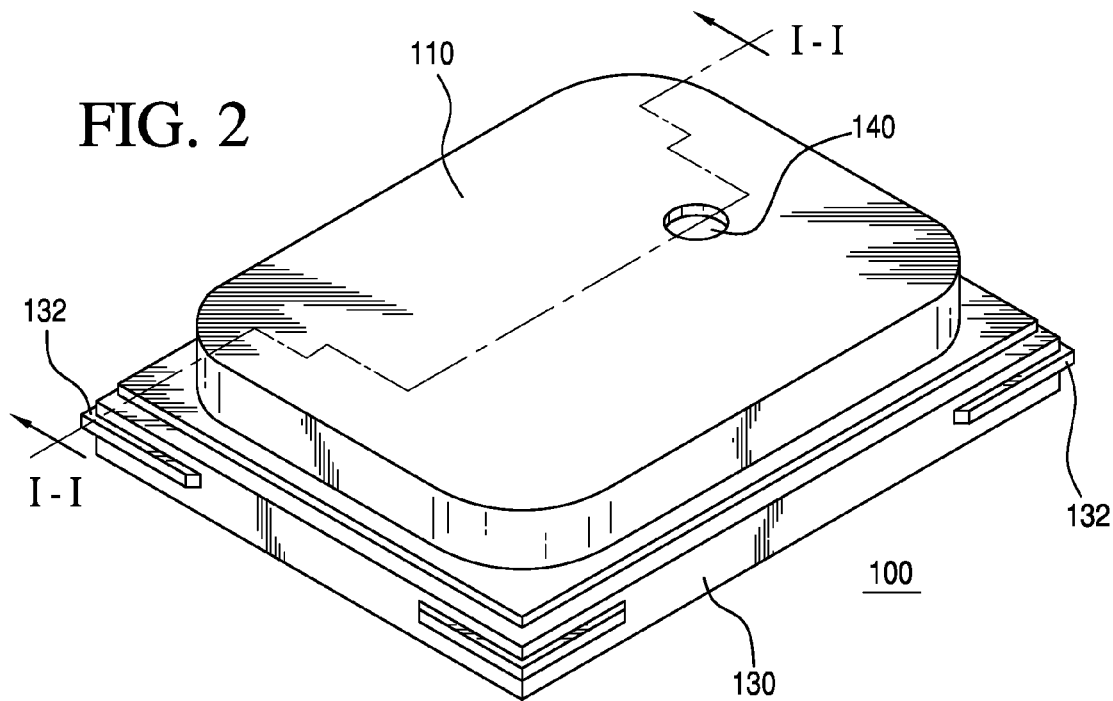
FIG. 2 illustrates a top, front, left isometric view of the semiconductor package of FIG. 1, according to the first embodiment.
Figure 3:
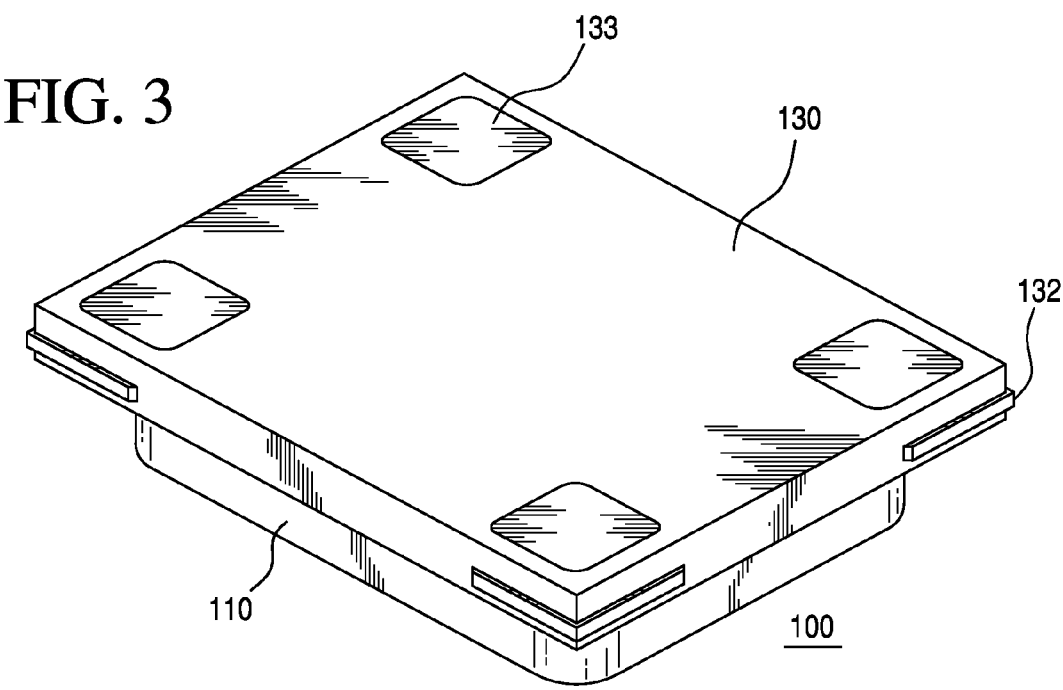
FIG. 3 illustrates a bottom, front, left isometric view of the semiconductor package of FIG. 1, according to the first embodiment.

Turning to the drawings, FIG. 1 illustrates a cross-sectional view of semiconductor package 100 along the I-I line (FIG. 2), according to a first embodiment. FIG. 2 illustrates a top, front, left isometric view of semiconductor package 100, according to the first embodiment. FIG. 3 illustrates a bottom, front, left isometric view of semiconductor package 100, according to the first embodiment. Semiconductor package 100 is merely exemplary and is not limited to the embodiments presented herein. Semiconductor package 100 can be employed in many different embodiments or examples not specifically depicted or described herein.

Figure 6:
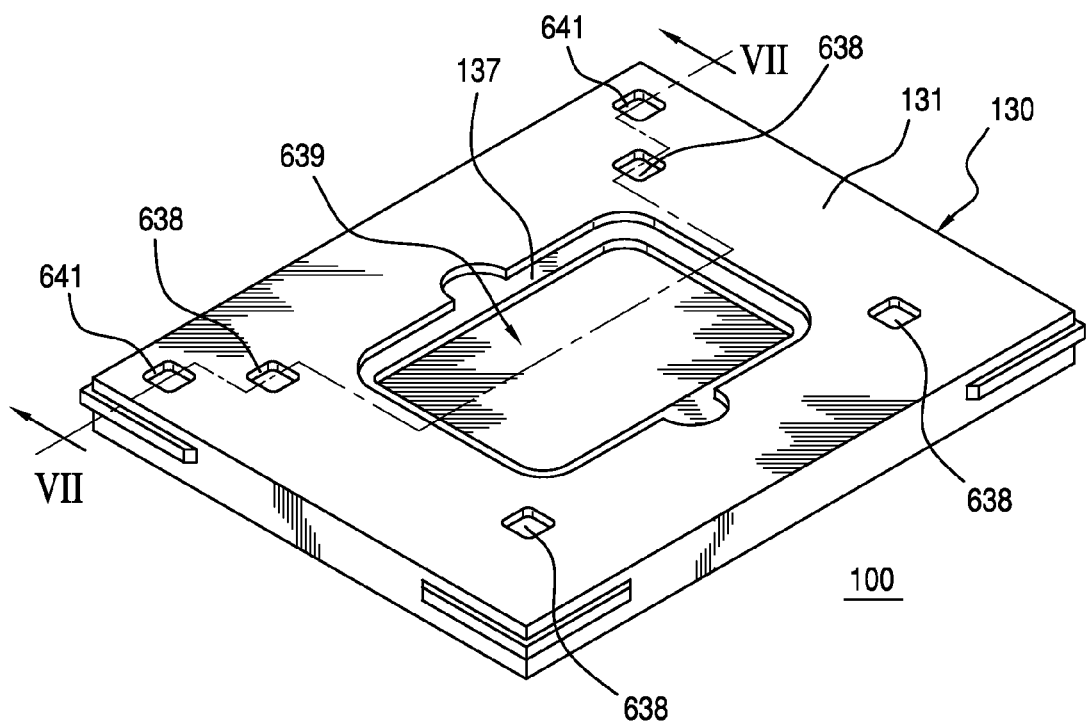
FIG. 6 illustrates a top, front, left isometric view of an example of the semiconductor package of FIG. 5 after providing non-electrically conductive material around the leadframe, according to the first embodiment.
Figure 14:
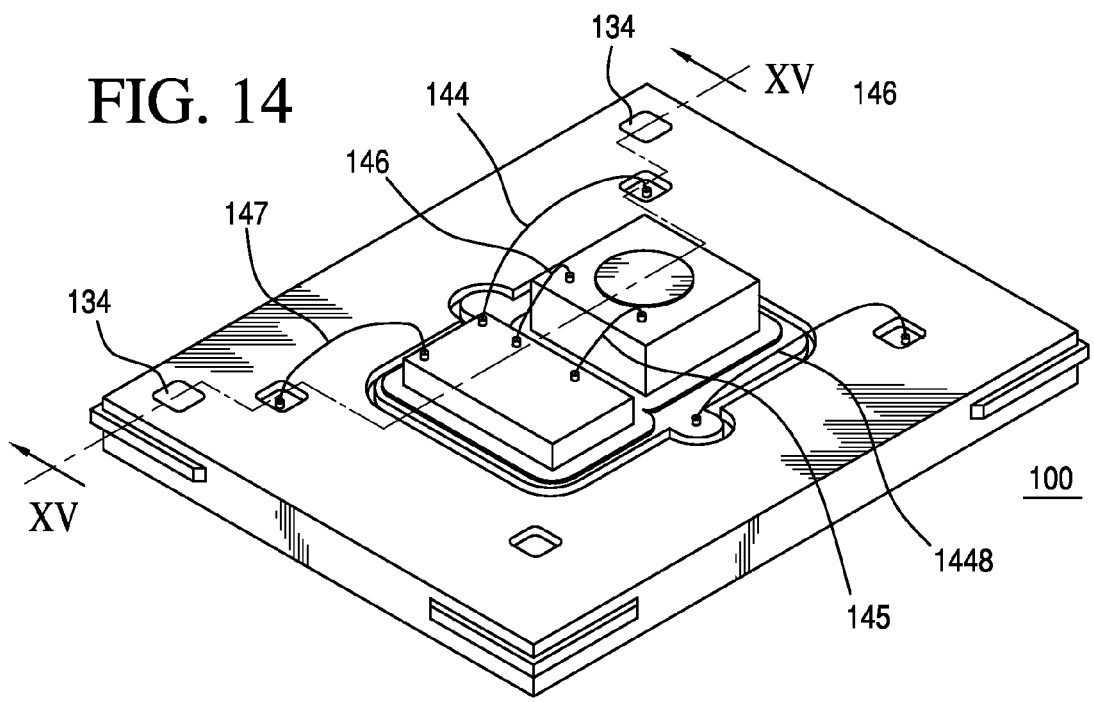
FIG. 14 illustrates a top, front, left isometric view of an example of the semiconductor package of FIG. 5 after wire bonding the interposer, the MEMS device, the electrical component, and the leadframe, according to the first embodiment.

In some embodiments, an air cavity package or semiconductor package 100 can be configured to electrically couple to a printed circuit board (PCB) (not shown). Semiconductor package 100 can include: (a) a lid 110; (b) a base 130 with a cavity 639 (FIG. 6); (c) an interposer 120; (d) at least one MEMS device 105; (d) at least one electrical component 106; and (e) one or more wires 144, 145, 146, 147, and 1448 (FIG. 14). Interposer 120 can be a separate or non-integrally formed element from base 130. In some examples, semiconductor package 100 does not include at least one electrical component 106.

In some examples, MEMS device 105 can be a MEMS microphone, which is commonly found in cellular telephones and other audio-related applications. In other examples, MEMS device 105 can include other types of semiconductor sensors such as altimeters, chemical sensors, or light sensors.

Electrical component 106 can be an application specific integrated circuit (ASIC). In other examples, electrical component 106 can be a passive device (e.g., a capacitor, a resistor, or inductor) or single active device (e.g., a power transistor). In still further embodiments, electrical component 106 can be one or more ASICs and one or more passive devices. In some examples, wires 145 and 146 can electrically couple electrical component 106 to MEMS device 105.

In some examples, base 130 can include: (a) leadframe 132; (b) non-electrically conductive material 131 with apertures 638 (FIG. 6), 641 (FIG. 6), and 736 (FIG. 7); and (c) mounting pads 133 and 134 located at least partially in apertures 641 (FIG. 6) and 736 (FIG. 7), respectively. Apertures 638 (FIG. 6) provide access to leadframe 132 such leadframe 132 can be electrically coupled to MEMS device 105, electrical component 106, and/or interposer 120 using wires (e.g. wires 144, 147, and 1448 (FIG. 14)). Mounting pads 133 (e.g., outer-connected lands or surface mount pads on semiconductor package 100) can be used to couple semiconductor package 100 to a PCB (not shown) by, for example, surface mount adhesive techniques (SMT), solder balls, or flip chip techniques.

Figure 5:
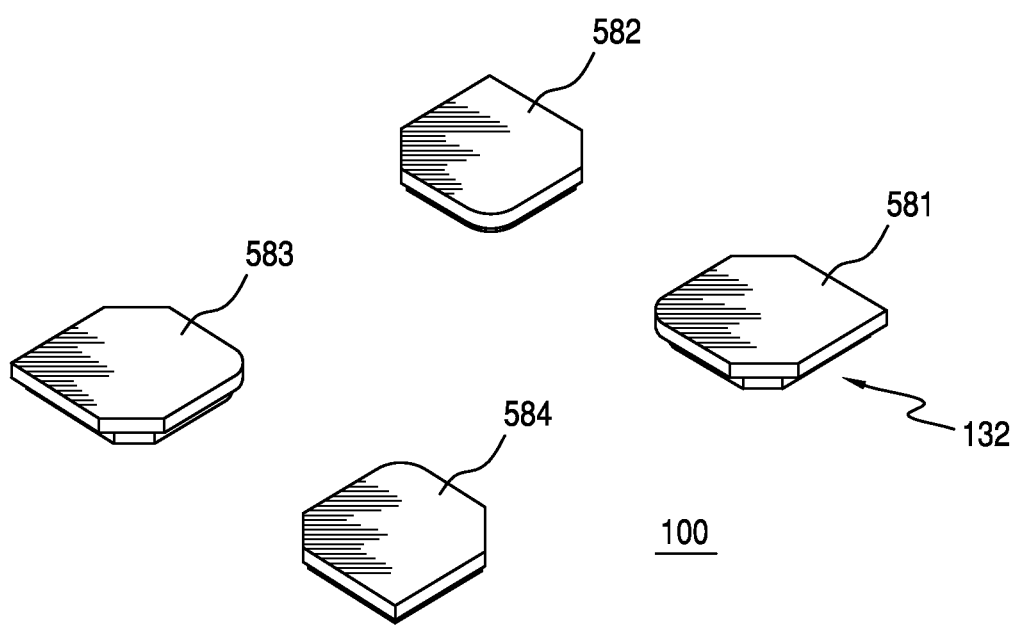
FIG. 5 illustrates a top, front, left isometric view of an example of a semiconductor package after the providing leadframe, according to the first embodiment.

In many embodiments, leadframe 132 can include electrical leads 581, 582, 583, and 584 (FIG. 5). In one example, electrical leads 582 and 583 can be coupled to ground. Lead 581 can be coupled to electrical power, and lead 584 can be an electrical signal lead. In other examples, leads 581, 582, 583, and 584 can have different uses.

In various embodiments, electrical leads 581, 582, 583, and 584 can have a thickness of approximately 0.13 millimeters (mm) and a length and width of approximately 0.20 mm. In one embodiment, electrical leads 581, 582, 583, and 584 can have squared off corners. However, the present invention is not limited by any specific material, size, or thickness of electrical leads 581, 582, 583, and 584.

In some examples, non-electrically conductive material 131 can be located around leadframe 132. Furthermore, non-electrically conductive material can have cavity 639 (FIG. 6) with a bottom 125 and a shelf 137. Shelf 137 can be designed such that interposer 120 can rest and be mechanically coupled to shelf 137. When interposer 120 is coupled to shelf 137, non-electrically conductive material 131 and interposer 120 form a back chamber 108 there between. For example, interposer 120 can act as a top of cavity 639 and thereby form an interior space (i.e., back chamber 108). Including back chamber 108 in base 130 can improve the performance of MEMS device 105.

In many embodiments, bottom 125 can have a first height (e.g., 0.20 mm) measured from bottom surface 126 of non-electrically conductive material 131; shelf 137 can have a second height (e.g., 0.30 mm) measured from bottom surface 126; and top surface 127 of non-electrically conductive material 131 can have a third height (e.g., 0.40 mm) measured from bottom surface 126. Accordingly, the first height can be less than the second height, and the second height can be less than the third height. Furthermore, interposer 120 can have a first thickness (e.g., 0.10 mm or 0.065 mm) In some examples, the first thickness is substantially equal to or less than a difference in height between the second height and the third height.

In some embodiments, non-electrically conductive material 131 can comprise LCP (liquid crystal polymer) plastic, PEEK (polyetheretherketone) plastic, ABS (acrylonitrile butadiene styrene) plastic, PCV (polyvinyl chloride) plastic, PCB (polychlorinated biphenyl) plastic, an epoxy resin, BT (bismaleimide triazine resin) laminate, an organic laminate, or the equivalent. In some examples, LCP is preferred over other materials because of material stiffness, good dimensional stability with low shrinkage (especially at high temperatures), and good mold flow in thin sections (e.g., thin wall capability).

In many embodiments, interposer 120 can be used to electrically couple MEMS device 105 and/or electrical component 106 to ground, power, or an electrical signal. MEMS device 105 and electrical component 106 can be located over interposer 120. In various embodiments, MEMS device 105 and/or electrical component 106 can be electrically coupled to interposer 120. In these examples, interposer 120 can be electrically coupled to leadframe 132 using wires 144 and thus, electrically coupling MEMS device 105 and/or electrical component 106 to leadframe 132.

In many examples, interposer 120 has an aperture 142, which interconnects back chamber 108 and interior cavity 107. In some examples, MEMS device 105 is at least partially located over aperture 142. MEMS device 105 can have an opening 143 between interior cavity 107 to aperture 142. In some examples, aperture 142 and opening 143 can each have a diameter of 0.50 mm. In other examples, aperture 142 and opening 143 can have different sizes. In the same or different examples, MEMS device 105 can have a membrane 139 in opening 143. In the illustrated example, membrane 139 is located at the top side of MEMS device 105 and opening 143 opens into aperture 142.

In the same or different embodiments, interposer 120 can be a piece of metal. For example, interposer 120 can be copper alloy or stainless steel (e.g., stainless steel 304). In various examples, interposer 120 is thin, and thus, the strength of steel makes it preferable over other metals because it does not sag into back chamber 108. In other examples, interposer 120 can be made from plastic and coated with a metal (e.g., copper or gold). In other examples, interposer 120 can be a printed circuit board or a flex circuit (e.g. Kapton® circuit).

Figure 10:
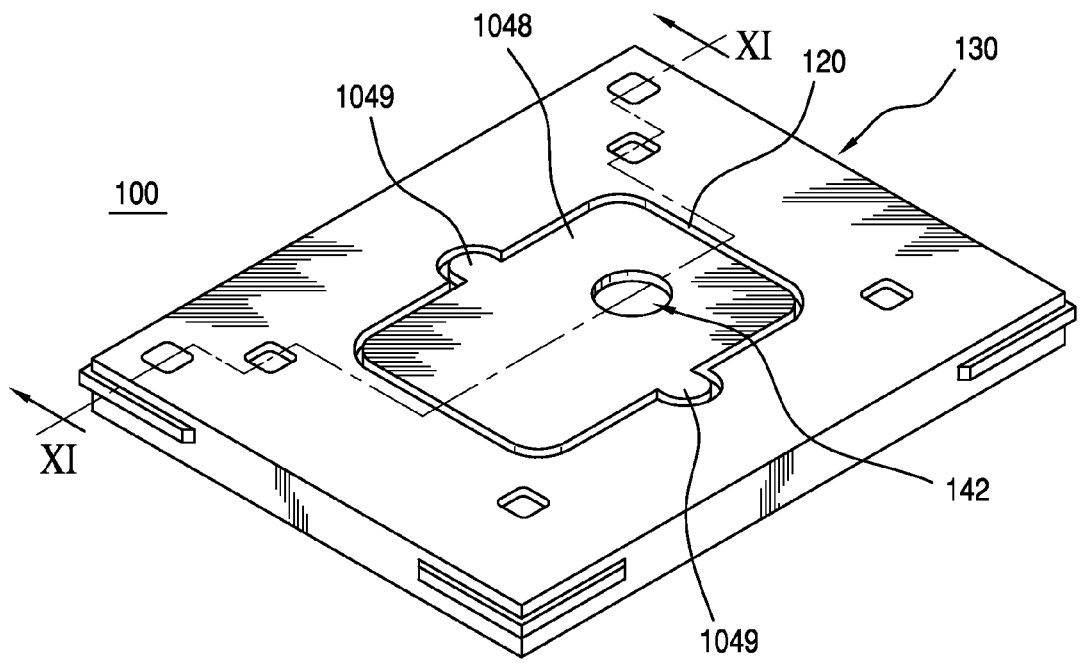
FIG. 10 illustrates a top, front, left isometric view of an example of the semiconductor package of FIG. 5 after coupling an interposer to a base, according to the first embodiment.

As illustrated FIG. 10, in many embodiments, interposer 120 can have a substantially rectangular body 1048 with two wire bonding regions 1049 protruding therefrom. Wire 144 can be coupled to interposer 120 at one of wire bonding regions 1049, as illustrated in FIG. 14. In other examples, interposer 120 can have different shapes such as a circle, a square, an irregular shape, or a combination thereof In the same or different examples, interposer 120 can have none, one, or three or more wire bonding regions.

Referring again to FIG. 1, lid 110 can be coupled to base 130 such that interior cavity 107 exists between lid 110 and base 130. MEMS device 105 and electrical component 106 can be located in interior cavity 107. Lid 110 and base 130 can be coupled using both non-electrically conductive epoxy or the equivalent, and solder or conductive epoxy, to provide the electrical interconnects needed to electrically couple (and ground) lid 110 to leadframe 132. In the example illustrated in FIGS. 1-3, lid 110 is electrically coupled to leadframe 132 using mounting pads 134.

In many examples, lid 110 can have a port hole or an acoustic hole 140. Acoustic hole 140 can be included in lid 110 because many MEMS devices need a path to received sound, air pressure, external fluids, airborne chemicals, etc. In various embodiments, acoustic hole 140 can include a coating to prevent environmental hazards like particles, dust, corrosive gases, and humidity from entering internal cavity 107. In many embodiments, acoustic hole 140 is located in the top of lid 110. In other embodiments, acoustic hole 140 can be located in the sides of lid 110 or base 130.

In some examples, lid 110 can be metal. The metal lid can be used for radio frequency shielding. For example, lid 110 can include steel, a copper alloy, an aluminum alloy, an iron alloy with solderable metal finish, a plastic (e.g., LCP) with a metal coating (e.g. formed by electroless plating or painting), or a conductive composite (e.g., formed by transfer or injection molding). In some examples, a metal lid can be used because a metal lid can provide greater electromagnetic shielding. In other examples, LCP with a metal coating can be used because the metal coating can be used as an electrical or signal interconnection.

Figure 4:
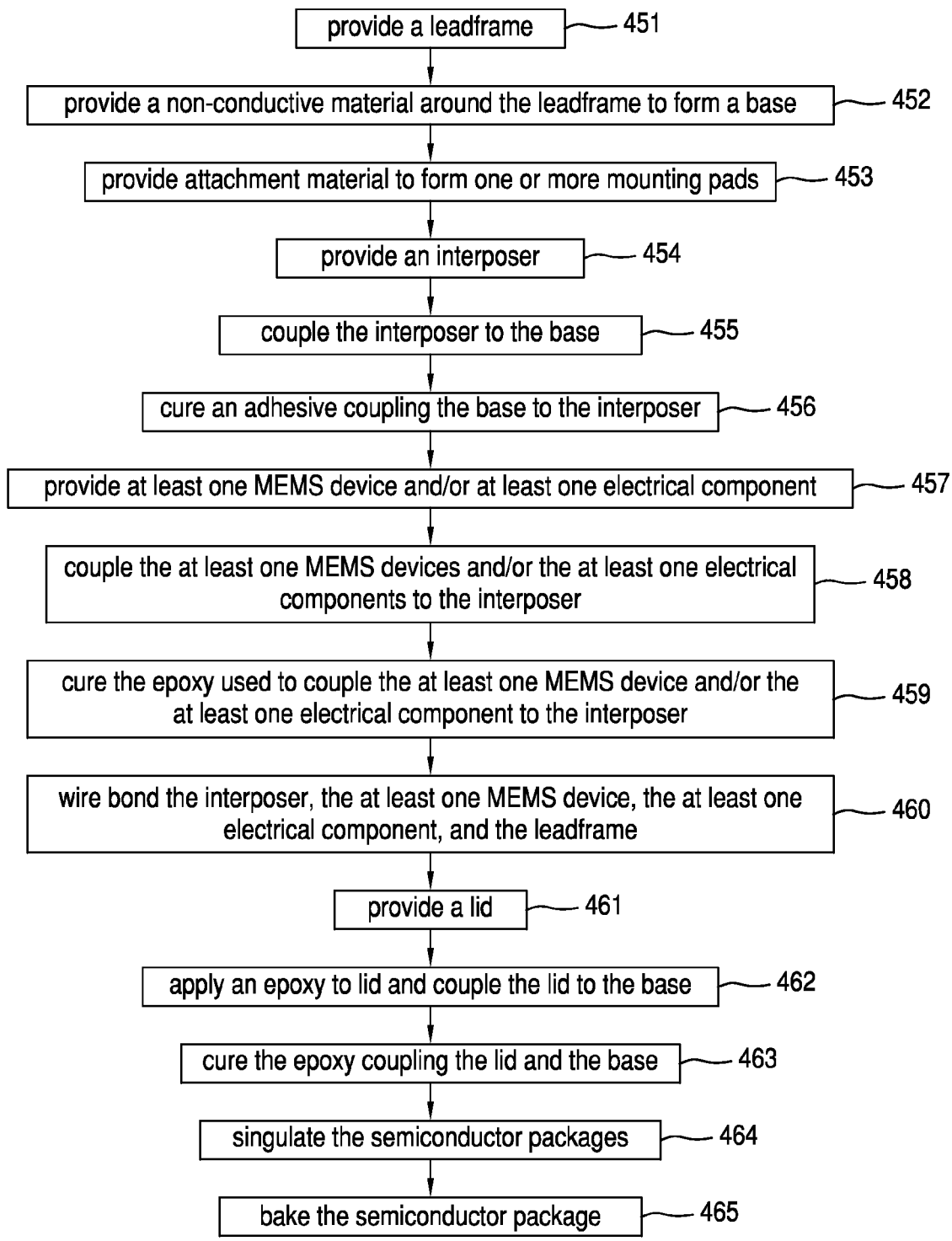
FIG. 4 illustrates a flow chart for an embodiment of a method of manufacturing a semiconductor package, according to the first embodiment.

FIG. 4 illustrates a flow chart for an embodiment of a method 400 of manufacturing a semiconductor package, according to the first embodiment. Method 400 is merely exemplary and is not limited to the embodiments presented herein. Method 400 can be employed in many different embodiments or examples not specifically depicted or described herein Referring to FIG. 4, method 400 includes an activity 451 of providing a leadframe. FIG. 5 illustrates a top, front, left isometric view of an example of a semiconductor package after the providing leadframe 132, according to the first embodiment. Leadframe 132 may be formed by cutting, stamping or etching sheet stock into a strip or array format. The sheet stock from which leadframe 132 is formed can be a conductive metal like copper or aluminum, although other metals or alloys can be used. FIG. 5 illustrates an example where leadframe 132 include four separate electrical leads 581, 582, 583, and 584. In other examples, the leadframe can be similar or identical to leadframe 2032 or 2732 of FIGS. 20 and 27, respectively.

In some examples, activity 451 can include cleaning the leadframe. For example, leadframe 132 can be cleaned using a plasma cleaning process to remove oxides and other contaminants from surfaces of the leadframe before proceeding with method 400.

Figure 7:
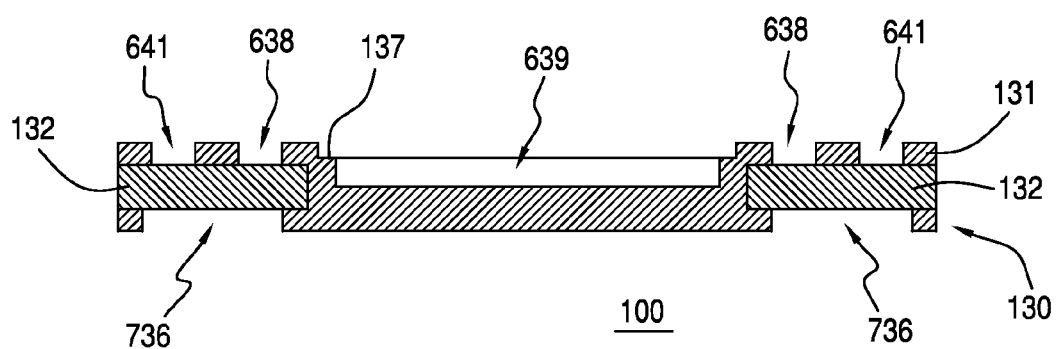
FIG. 7 illustrates a cross-sectional view of the semiconductor package of FIG. 5 along the VII-VII line (FIG. 6) after providing the non-electrically conductive material around the leadframe, according to the first embodiment.

Referring again to FIG. 4, method 400 continues with an activity 452 of providing a non-electrically conductive material around the leadframe to form a base. FIG. 6 illustrates a top, front, left isometric view of an example of semiconductor package 100 after providing non-electrically conductive material 131 around leadframe 132, according to the first embodiment. FIG. 7 illustrates a cross-sectional view of semiconductor package 100 along the VII-VII line (FIG. 6) after providing non-electrically conductive material 131 around leadframe 132, according to the first embodiment. As shown in FIGS. 6 and 7, non-electrically conductive material 131 can have interior cavity 107 with shelf 137 and one or more aperture 736, 638, and 641. In some examples, the base formed by activity 452 can be similar or identical to base 130, 1730, or 1830 of FIGS. 1, 17 and 18, respectively.

In some embodiments, providing a non-electrically conductive material around the leadframe can include molding a plastic around the leadframe. For example, a transfer or injection molding process can be used. In some embodiments, the non-electrically conductive material can be LCP plastic, PEEK plastic, ABS plastic, PCV plastic, PCB plastic, an epoxy resin, BT laminate, an organic laminate, or the equivalent.

Figure 8:
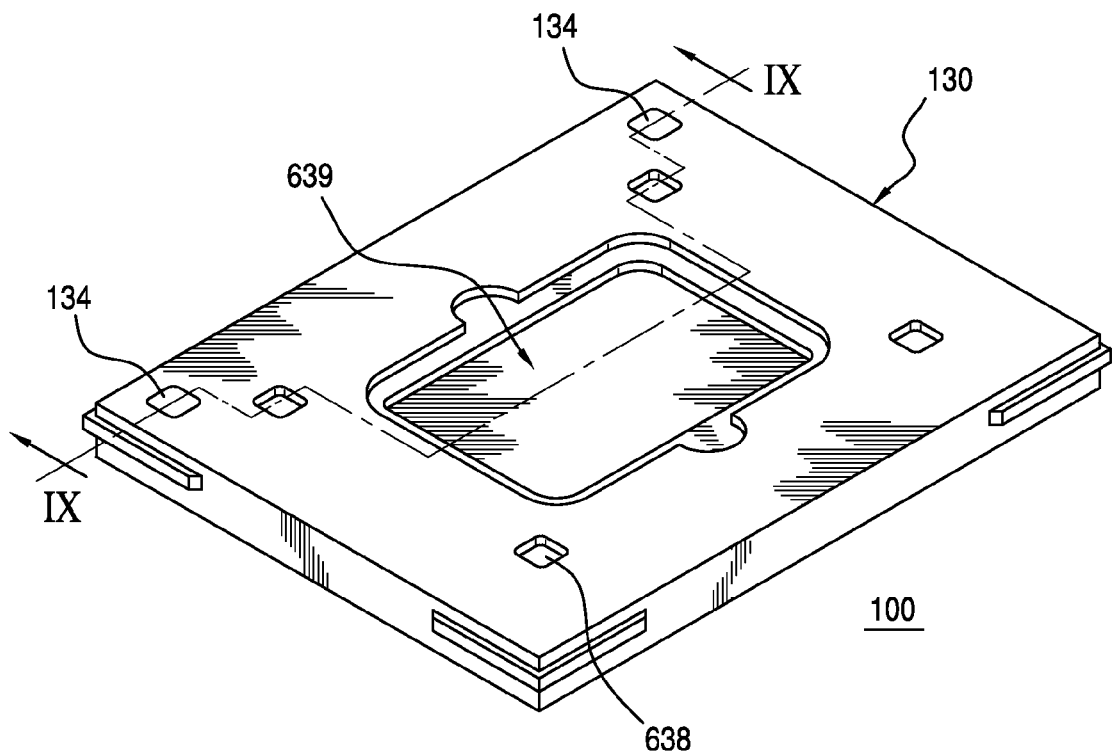
FIG. 8 illustrates a top, front, left isometric view of an example of the semiconductor package of FIG. 5 after providing attachment material to form mounting pads, according to the first embodiment.
Figure 9:
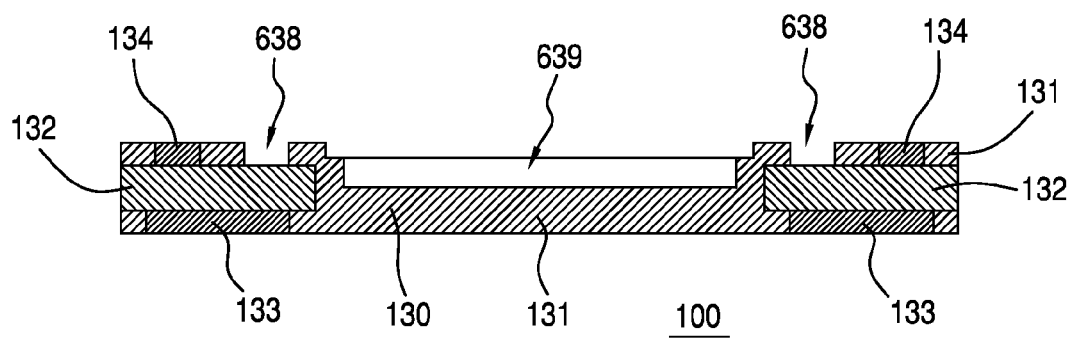
FIG. 9 illustrates a cross-sectional view of the semiconductor package of FIG. 5 along the IX-IX line (FIG. 8) after providing the attachment material to form the mounting pads, according to the first embodiment.

Referring again to FIG. 4, method 400 further includes an activity 453 of providing attachment material to form one or more mounting pads. FIG. 8 illustrates a top, front, left isometric view of an example of semiconductor package 100 after providing attachment material to form mounting pads 133 and 134, according to the first embodiment. FIG. 9 illustrates a cross-sectional view of semiconductor package 100 along the IX-IX line (FIG. 8) after providing attachment material to form mounting pads 133 and 134, according to the first embodiment. Referencing FIGS. 8 and 9, a conductive material is applied to base 130 to create mounting pads 134 and 133. Mounting pads 134 will be coupled to lid 110 in activity 462 (FIG. 4). Mounting pads 133 can be used to couple semiconductor package 100 to a PCB by, for example, a SMT technique.

In some embodiments, the attachment material can be at least partially provided in apertures 641 and 736 (FIG. 7) to form mounting pads 134 and 133, respectively. For example, mounting pads 133 can be formed by providing solder in aperture 736 by screen printing or solder bumping. Mounting pad 134 can be formed by providing solder or conductive epoxy (either by screen print, solder bumping, solder dispensing or conductive epoxy dispensing) in aperture 641. In other embodiments, forming mounting pads 133 or 134 may not be necessary and at least a portion of activity 453 can be skipped.

Referring again to FIG. 4, method 400 includes an activity 454 of providing an interposer. In some examples, the interposer can be similar or identical to interposer 120, 1720, or 2420 of FIGS. 1, 17, and 24, respectively.

Figure 11:
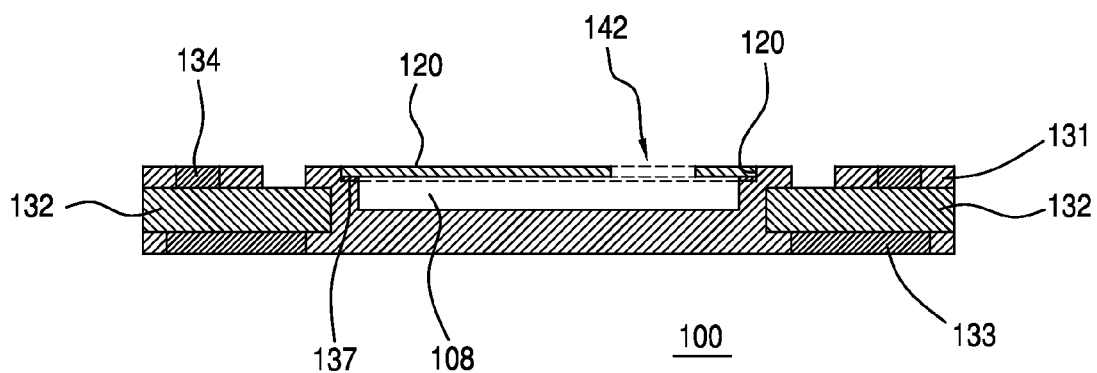
FIG. 11 illustrates a cross-sectional view of the semiconductor package of FIG. 5 along the XI-XI line (FIG. 10) after coupling the interposer to the base, according to the first embodiment.

Method 400 continues with an activity 455 of coupling the interposer to the base. FIG. 10 illustrates a top, front, left isometric view of an example of semiconductor package 100 after coupling interposer 120 to base 130, according to the first embodiment. FIG. 11 illustrates a cross-sectional view of semiconductor package 100 along the XI-XI line (FIG. 10) after coupling interposer 120 to base 130, according to the first embodiment. Referring to FIGS. 10 and 11, when interposer 120 is coupled to base 130, back chamber 108 is formed with interposer 120 being a top of back chamber 108.

Figure 17:
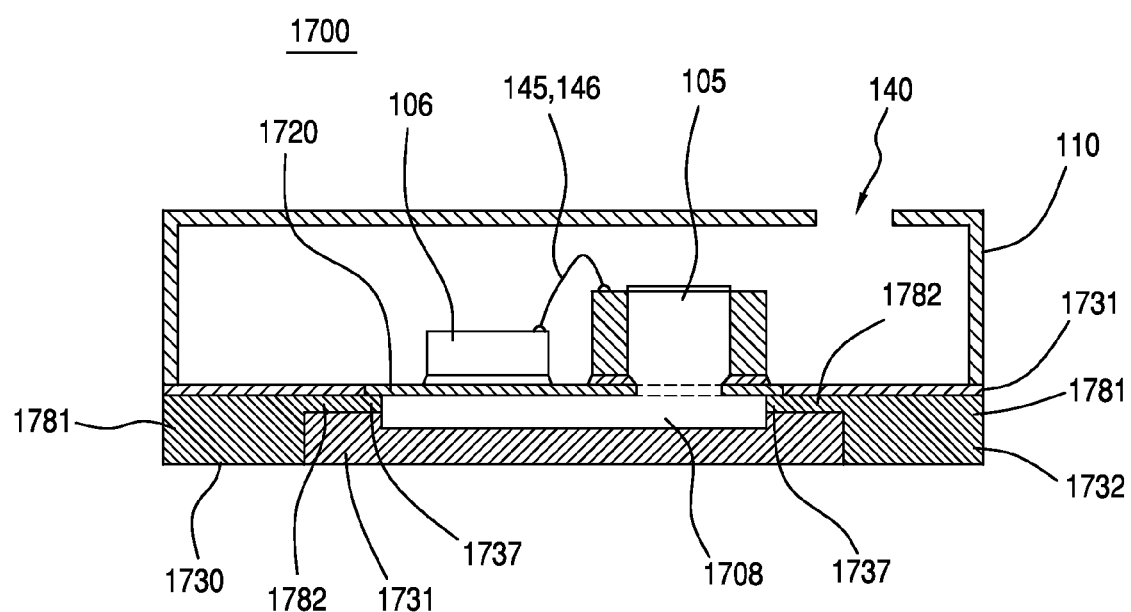
FIG. 17 illustrates a cross-sectional view of a semiconductor package, according to a second embodiment.

In some examples, interposer 120 can be coupled to non-electrically conductive material 131. Interposer 120 can rest on shelf 137 and be mechanically coupled to non-electrically conductive material 131 using an adhesive (not shown). In some examples, interposer 120 can be coupled to non-electrically conductive material 131 using adhesive film (e.g. B-stageable adhesive film), conductive epoxy and/or non-conductive epoxy In other embodiments, interposer 120 can be attached to an electrically conductive portion of base 130. For example, as illustrated in FIG. 17, shelf 137 (FIG. 1) can be replaced with an electrically conductive shelf 1737. In this example, an electrically conductive adhesive can be used to electrically and mechanically couple interposer 1720 to electrically conductive shelf 1737. In this example, coupling interposer 1720 to base 1730 creates an electrical connection between interposer 1720 and base 1730, and wire bonds are not necessary to electrically couple interposer 1720 to leadframe 1732.

Referring again to FIG. 4, method 400 continues with an activity 456 of curing the adhesive coupling the base to the interposer. In some examples, the adhesive applied in activity 455 needs to be cured. For example, when epoxy is used, it can be cured for approximately 60 minutes at approximately 175 degrees Celsius (° C.). In further examples, other curing profiles can be used to assure a complete curing of the adhesive. In still other embodiments, if the base and interposer are coupled to the interposer using a method that does not require curing, activity 456 can be omitted.

Referring again to FIG. 4, method 400 includes an activity 457 of providing at least one MEMS device and/or at least one electrical component. In some examples, the at least one MEMS device and the at least one electrical component can be similar or identical to MEMS device 105 and electrical component 106 of FIG. 1.

Figure 12:
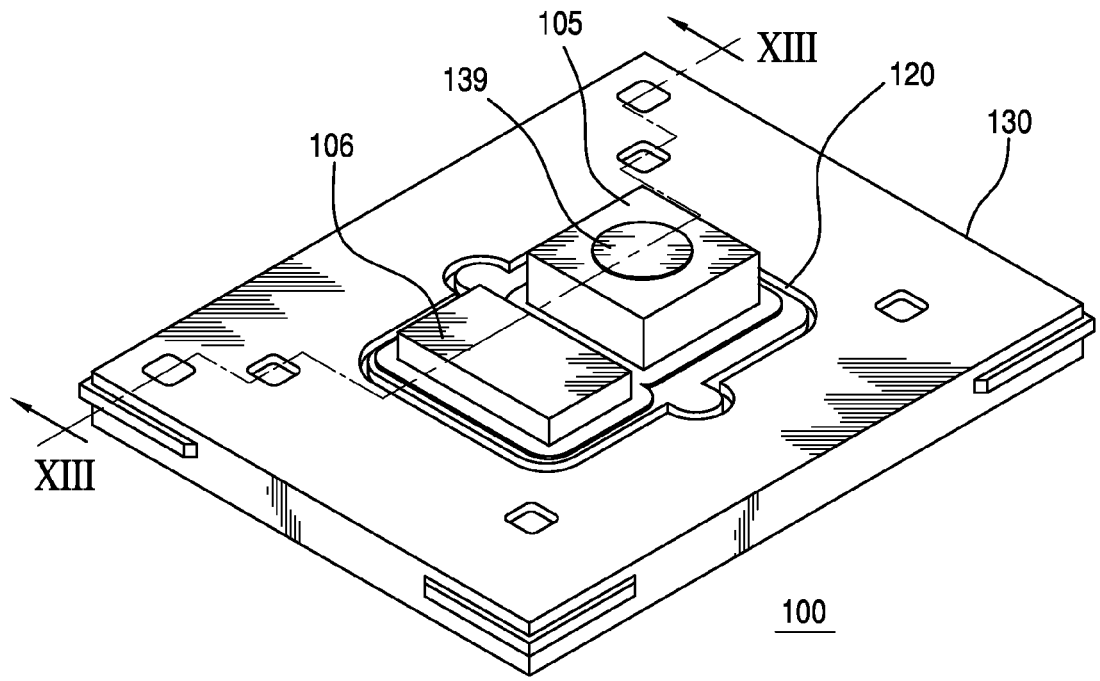
FIG. 12 illustrates a top, front, left isometric view of an example of semiconductor package of FIG. 5 after coupling at least one MEMS device and at least one electrical component to the interposer, according to the first embodiment.
Figure 13:
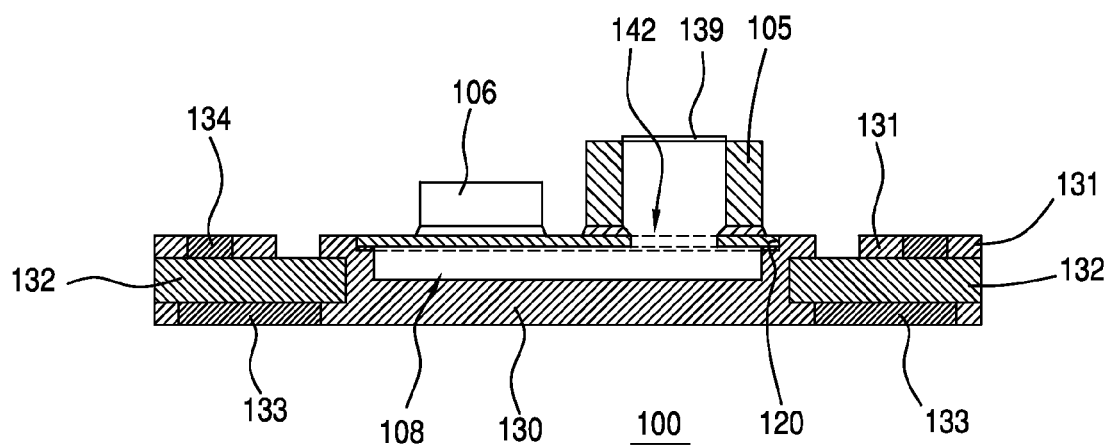
FIG. 13 illustrates a cross-sectional view of the semiconductor package of FIG. 5 along the XIII-XIII line (FIG. 12) after coupling at least one MEMS devices and at least one electrical components to the interposer, according to the first embodiment.

Method 400 continues with an activity 458 of coupling the at least one MEMS device and the at least one electrical component to the interposer. FIG. 12 illustrates a top, front, left isometric view of an example of semiconductor package 100 after coupling MEMS device 105 and electrical component 106 to interposer 120, according to the first embodiment. FIG. 13 illustrates a cross-sectional view of semiconductor package 100 along the XIII-XIII line (FIG. 12) after coupling MEMS device 105 and electrical component 106 to interposer 120, according to the first embodiment. MEMS device 105 and electrical component 106 can be coupled to interposer 120 using an epoxy. In some examples, MEMS device 105 and electrical component 106 can be pick-and-placed onto interposer 120. In the same or different examples, MEMS device 105 and electrical component 106 are coupled to interposer 120 using a die attach epoxy.

In the embodiment shown in FIGS. 1 and 12-15, one MEMS device and one electrical component are shown, but more than one MEMS device and more than one electrical component can be present.

Referring again to FIG. 4, method 400 continues with an activity 459 of curing the adhesive used to couple the MEMS device and/or the electrical component to the interposer. In some examples, the adhesive applied in activity 458 needs to be cured. For example, when epoxy is used, it can be cured for approximately 60 minutes at approximately 175 degrees Celsius (° C.). In further examples, other curing profiles can be used to assure a complete curing of the adhesive. In still other embodiments, if the MEMS device and electrical component are coupled to the interposer using a method that does not require curing, activity 459 can be omitted.

Figure 15:
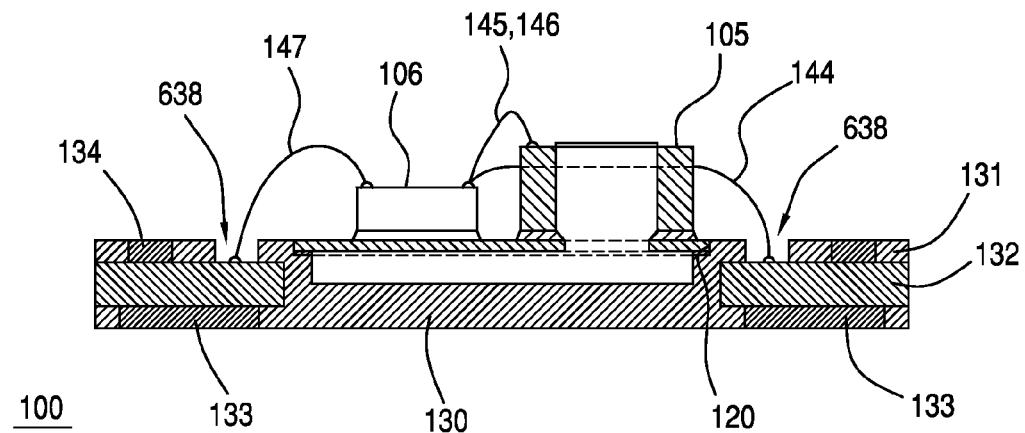
FIG. 15 illustrates a cross-sectional view of the semiconductor package of FIG. 5 along the XV-XV line (FIG. 14) after wire bonding the interposer, the MEMS device, the electrical component, and the leadframe, according to the first embodiment.

Method 400 continues with an activity 460 of wire bonding the interposer, the at least one MEMS device, the at least one electrical component, and the leadframe. FIG. 14 illustrates a top, front, left isometric view of an example of semiconductor package 100 after wire bonding interposer 120, MEMS device 105, electrical component 106, and leadframe 132, according to the first embodiment. FIG. 15 illustrates a cross-sectional view of semiconductor package 100 along the XV-XV line (FIG. 14) after wire bonding interposer 120, MEMS device 105, electrical component 106, and leadframe 132, according to the first embodiment.

In the example illustrated in FIGS. 14 and 15, MEMS device 105 is wire bonded to electrical component 106 using wires 145 and 146. Electrical component 106 is wire bonded to leadframe 132 using wires 144 and 147. Interposer 120 is wire bonded to leadframe 132 using wire 1448 (FIG. 14). In other examples, other combinations of wire bonding can be used. For example MEMS device 105 could be wire bonded to leadframe 132 or interposer 120. In a different embodiment, wire bending is not used and is replaced with solder balls, flip chip technologies, or the like. In the same or different embodiment, the interposer can be electrically coupled to the leadframe using a conductive adhesive.

Referring again to FIG. 4, method 400 includes an activity 461 of providing a lid. In some examples, the lid can be similar or identical to lid 110 of FIG. 1.

Figure 16:
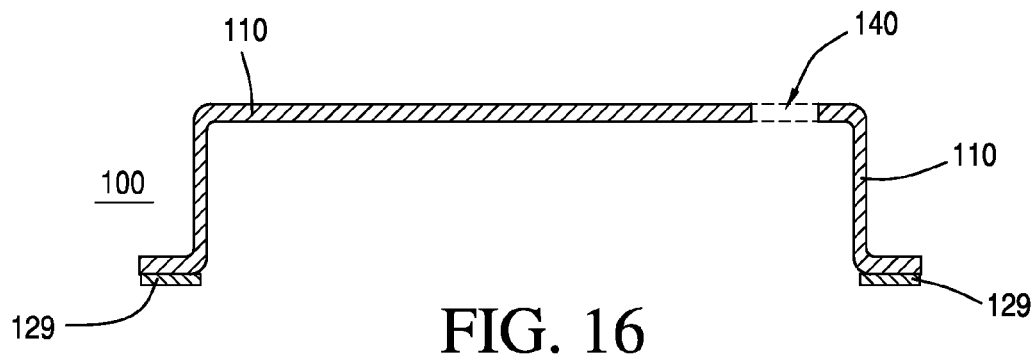
FIG. 16 illustrates a cross-sectional view of a lid after applying an epoxy to the lid, according to the first embodiment.

Referring again to FIG. 4, method 400 continues with an activity 462 of apply adhesive to a lid and coupling the lid to the base. As used herein, "coupling the lid to the base" refers to the procedure where the lid is coupled to the base and also refers to the procedure where the base is coupled to the lid. FIG. 16 illustrates a cross-sectional view of lid 110 after applying an adhesive 129 to lid 110, according to the first embodiment. In some examples, lid 110 can be metal. For example, lid 110 can include a copper alloy, an aluminum alloy, an iron alloy with solderable metal finish, a plastic with a metal finish (e.g. formed by electroless plating or painting), or a conductive composite (e.g., formed by transfer or injection molding). In some examples, ends of lid 110 can be coated with solder flux by reflowing mounting pads 133, which have been previously formed on base 130. In other examples, lid 110 can be coupled to base 130 using a conductive adhesive and/or non-electrically conductive adhesive.

Referring again to FIG. 4, method 400 continues with an activity 463 of curing the adhesive coupling the lid and the base. In some examples, the adhesive applied in activity 462 needs to be cured. For example, when epoxy is used, it can be cured for approximately 60 minutes at approximately 175 degrees Celsius (° C.). In further examples, other curing profiles can be used to assure a complete curing of the adhesive. In still other embodiments, if the lid and the base are coupled using a method that does not require curing, activity 463 can be omitted.

Method 400 continues with an activity 464 of singulating the semiconductor packages. In some examples, semiconductor package 100 is manufactured as a part of a set of two or more semiconductor packages. The two or more semiconductor packages are coupled together when the leadframe is provided in activity 451. In activity 464, the leadframes of the two or more semiconductor devices are separated from one another. In some examples, the semiconductor packages can be singulated using a trim and saw method. In other examples, the semiconductor packages can be singulated using a punch and saw method.

Method 400 continues with an activity 465 of baking the semiconductor package. For example, semiconductor package 100 can be baked for approximately 240 minutes at approximately 125° C. to remove moisture. Other baking process can be used depending on the requirements of the final product.

Turning to another embodiment, FIG. 17 illustrates a cross-sectional view of semiconductor package 1700, according to a second embodiment. In some embodiments, an air cavity packaging or semiconductor package 1700 can be configured to electrically couple to a printed circuit board (PCB) (not shown). Semiconductor package 1700 can include: (a) a base 1730 with a back chamber 1708; (b) lid 110 coupled to base 1730; (c) an interposer 1720; (d) at least one MEMS device 105; (d) at least one electrical component 106; and (e) one or more wires 145 and 146.

In some examples, base 1730 can include: (a) leadframe 1732 with one or more electrical leads; and (b) non-electrically conductive material 1731. In these examples, one or more of the electrical leads include: (a) a main body 1781; and (b) an arm 1782. In some examples, arm 1782 can be mechanically and electrically coupled to interposer 120. For example, arm 1782 of leadframe 1732 can be coupled to interposer 120 using a conductive adhesive. In some examples, arm 1782 can form electrically conductive shelf 1737 on which interposer 120 rests and is coupled. One or more of the electrical leads can be electrically coupled to MEMS device 105 and electrical component 106 through interposer 120.

Figure 18:
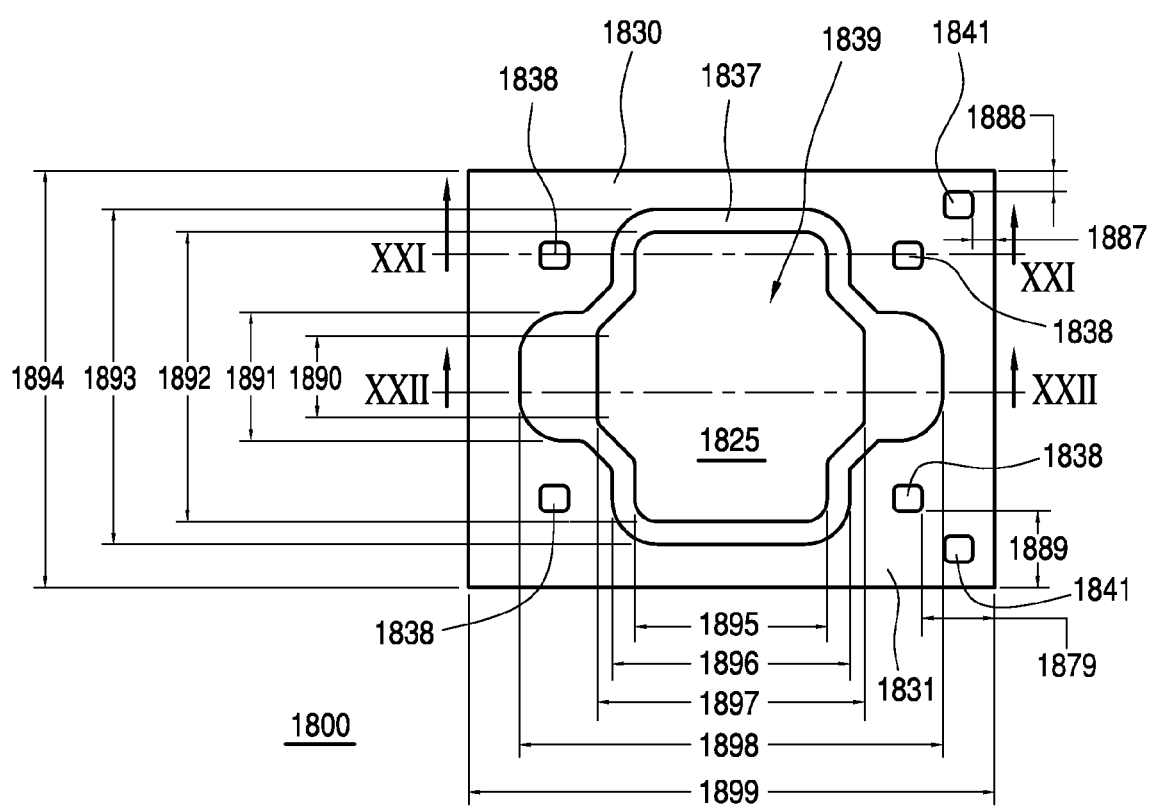
FIG. 18 illustrates a top view of a base of a semiconductor package, according to a third embodiment.
Figure 19:
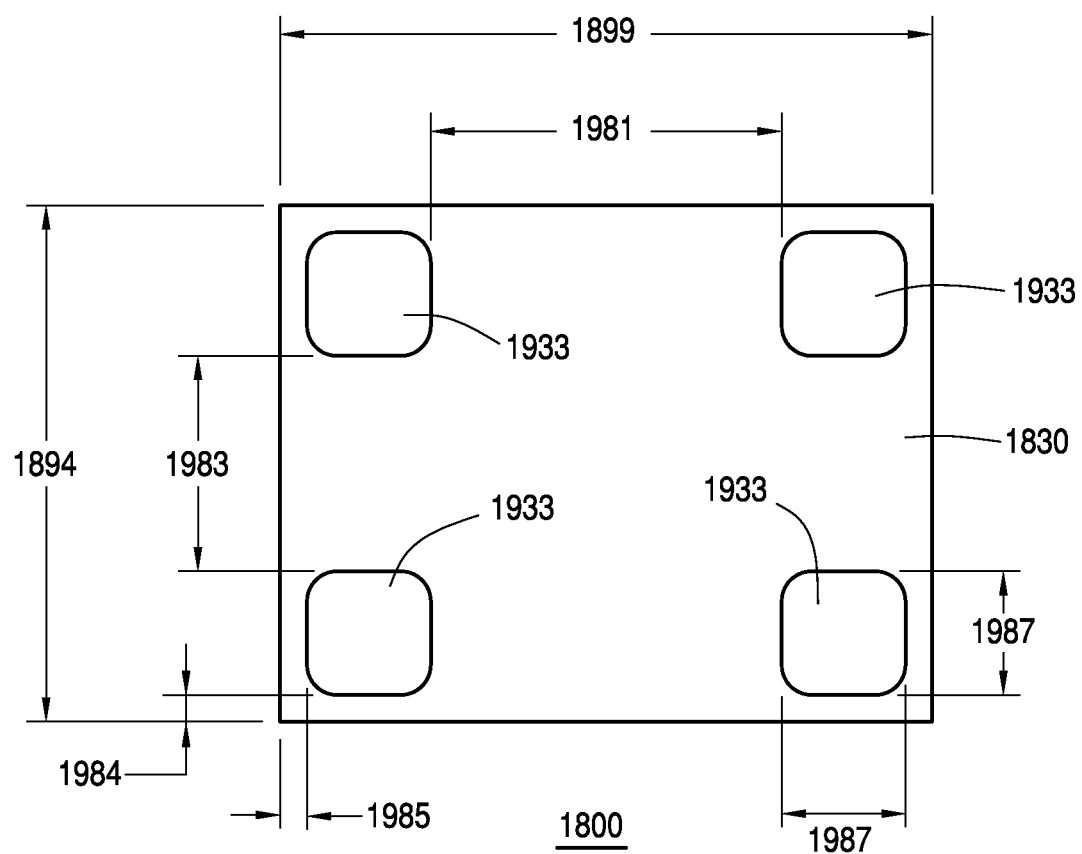
FIG. 19 illustrates a bottom view of the base of FIG. 18, according to the third embodiment.
Figure 20:
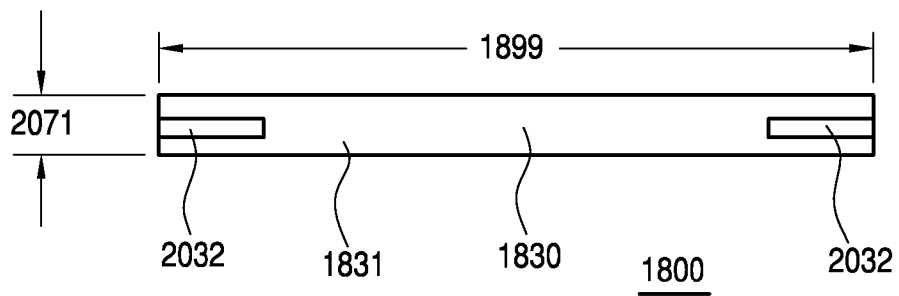
FIG. 20 illustrates a side view of the base of FIG. 18, according to the third embodiment.
Figure 21:
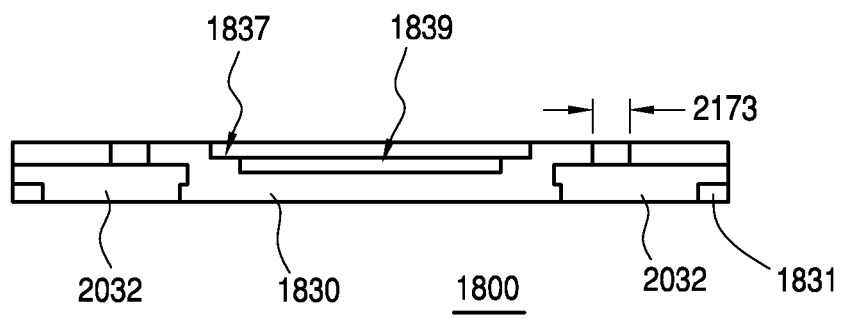
FIG. 21 illustrates a cross-sectional view of the base of FIG. 18 along the XXI-XXI line (FIG. 18), according to the third embodiment.
Figure 22:
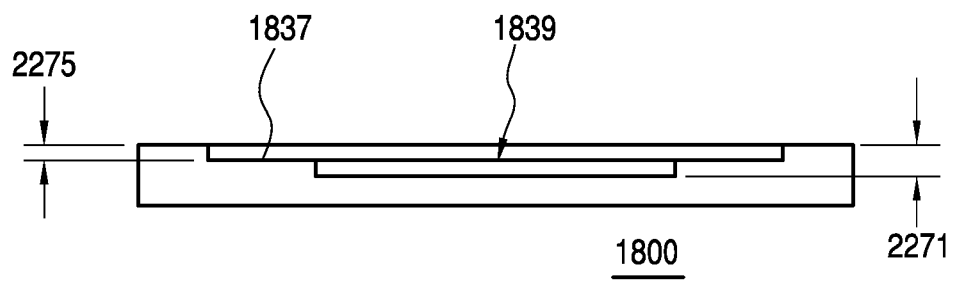
FIG. 22 illustrates a cross-sectional view of the base of FIG. 18 along the XXII-XXII line (FIG. 18), according to the third embodiment.
Figure 23:
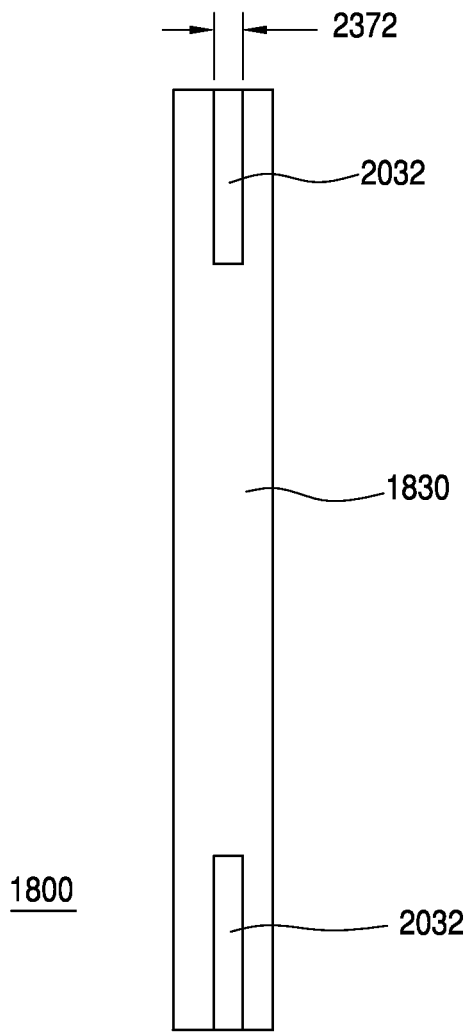
FIG. 23 illustrates a front view of the base of FIG. 18, according to the third embodiment.
Figure 24:
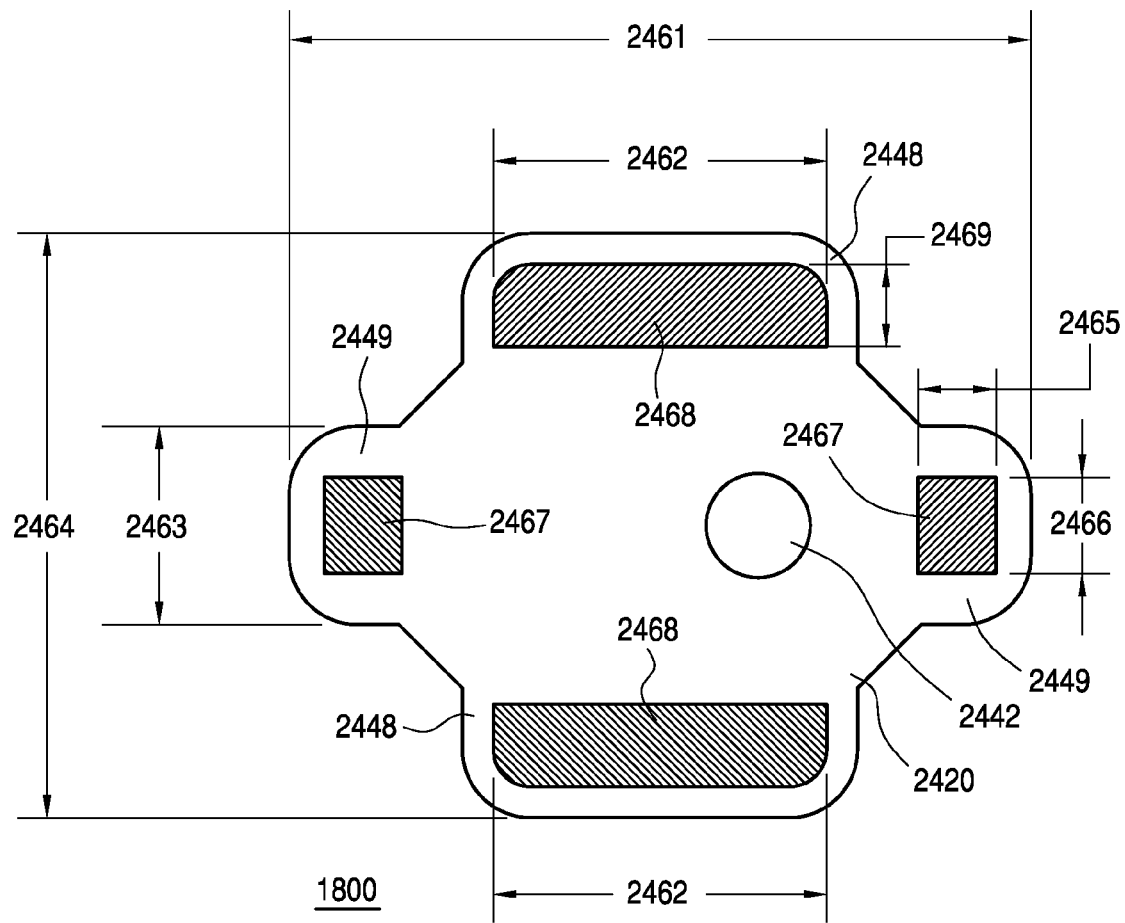
FIG. 24 illustrates a top view of an interposer of the semiconductor package of FIG. 18, according to the third embodiment.

Turning to yet another embodiment, FIG. 18 illustrates a top view of a base 1830 of a semiconductor package 1800, according to a third embodiment. FIG. 19 illustrates a bottom view of base 1830 of semiconductor package 1800, according to the third embodiment. FIG. 20 illustrates a side view of base 1830 of semiconductor package 1800, according to the third embodiment. FIG. 21 illustrates a cross-sectional view of base 1830 of semiconductor package 1800 along the XXI-XXI line (FIG. 18), according to the third embodiment. FIG. 22 illustrates a cross-sectional view of base 1830 of semiconductor package 1800 along the XXII-XXII line (FIG. 18), according to the third embodiment. FIG. 23 illustrates a front view of base 1830 of semiconductor package 1800, according to the third embodiment. FIG. 24 illustrates a top view of an interposer 2420 of semiconductor package 1800, according to the third embodiment. Semiconductor package 1800 is merely exemplary and is not limited to the embodiments presented herein. Semiconductor package 1800 can be employed in many different embodiments or examples not specifically depicted or described herein.

In some embodiments, an air cavity packaging or semiconductor package 1800 can be configured to electrically couple to a printed circuit board (PCB) (not shown). Semiconductor package 1800 can include: (a) a lid (not shown); (b) a base 1830 with a back chamber (not shown) and coupled to the lid; (c) an interposer 2420 (FIG. 24); (d) at least one micro-electro-mechanical system (MEMS) device (not shown); (d) at least one electrical component (not shown); and (e) one or more wires (not shown).

In some examples, base 1830 can include: (a) leadframe 2032 (FIG. 20); and (b) non-electrically conductive material 1831. In some examples, non-electrically conductive material 1831 can be located around leadframe 2032. Furthermore, non-electrically conductive material can have a cavity 1839 with a bottom 1825 and a shelf 1837. Shelf 1837 can be configured such that interposer 2420 (FIG. 24) can rest and be coupled to shelf 1837. When interposer 2420 is coupled to shelf 1837, non-electrically conductive material 1831 and interposer 2420 form a back chamber there between.

Referring to FIGS. 18-23, in one example, the front half of base 1830 can be symmetric with the back half of base 1830. Similarly, with the exception of mounting pads 1841, the left half of base 1830 can be symmetric with the right half of base 1830. In the same or different example, base 1830 can have a length 1894 of approximately 3.76 mm, a width 1899 of approximately 4.72 mm, and a thickness 2071 (FIG. 20) of approximately 0.40 mm. Leadframe 2032 can have a thickness 2372 (FIG. 23) of approximately 0.13 mm.

As shown in FIG. 18, mounting pads 1841 can have a diameter 2173 of approximately 0.25 mm and be offset from the side edge of base 1830 by a distance 1887 of approximately 0.20 mm and offset from the front or back edge of base 1830 by a distance 1888 of approximately 0.20 mm. Similarly, mounting pads 1838 can have a diameter of approximately 0.25 mm and be offset from the side edge of base 1830 by a distance 1879 of approximately 0.65 mm and offset from the front or back edge of base 1830 by a distance 1889 of approximately 0.65 mm.

As shown in FIG. 20, cavity 1839 can have a depth 2271 of approximately 0.20 mm and shelf 1837 can have a depth 2275 of approximately 0.10 mm. As shown in FIG. 18, cavity 1839 including shelf 1837 can have a maximum outer width 1898 of approximately 3.80 mm and a maximum outer length 1893 of approximately 3.04 mm. Cavity 1839 without shelf 1837 can have a maximum outer width 1897 of approximately 2.40 mm and a maximum outer length 1892 of approximately 2.64 mm.

Similarly, cavity 1839 including shelf 1837 can have a minimum outer width 1896 of approximately 2.12 mm and a minimum outer length 1891 of approximately 1.16 mm. Cavity 1839 without shelf 1837 can have a minimum outer width 1895 of approximately 1.72 mm and a minimum outer length 1890 of approximately 0.74 mm.

As shown in FIG. 19, mounting pads 1933 can have a diameter 1987 of approximately 0.9 mm and be offset from the side edge of base 1830 by a distance 1985 of approximately 0.20 mm and offset from the front or back edge of base 1830 by a distance 1984 of approximately 0.20 mm. The distance 1983 between the front mounting pads 1933 and the back mounting pads 1933 is approximately 1.56 mm. The distance 1981 between the left mounting pads 1933 and the right mounting pads 1933 can be approximately 2.52 mm.

Referring to FIG. 24, interposer 2420 can have an aperture 2442 and wire bonding regions 2448 and 2449. Wire bonding regions 2448 and 2449 can have wire bonding pads 2468 and 2467, respectively and be plated with gold (Au), silver (Ag), copper (CU), or Ni/Pd/Au where Ni is nickel and Pd is lead.

Interposer 2420 can have thickness of approximately 0.065 mm and a maximum outer width 2461 of approximately 3.60 mm and a maximum outer length 2464 of approximately 2.84 mm. Aperture 2442 can have a diameter of approximately 0.50 mm. Wire bonding pads 2467 can have a width 2465 of approximately 0.37 mm and a length 2466 of approximately 0.46 mm. Wire bonding pads 2468 can have a width 2462 of approximately 1.62 mm and a length 2469 of approximately 0.40 mm. Wire bonding regions 2449 can have a length 2463 of approximately 0.96 mm. Wire bonding regions 2448 can a width 2462 of approximately 1.92 mm.

Figure 25:
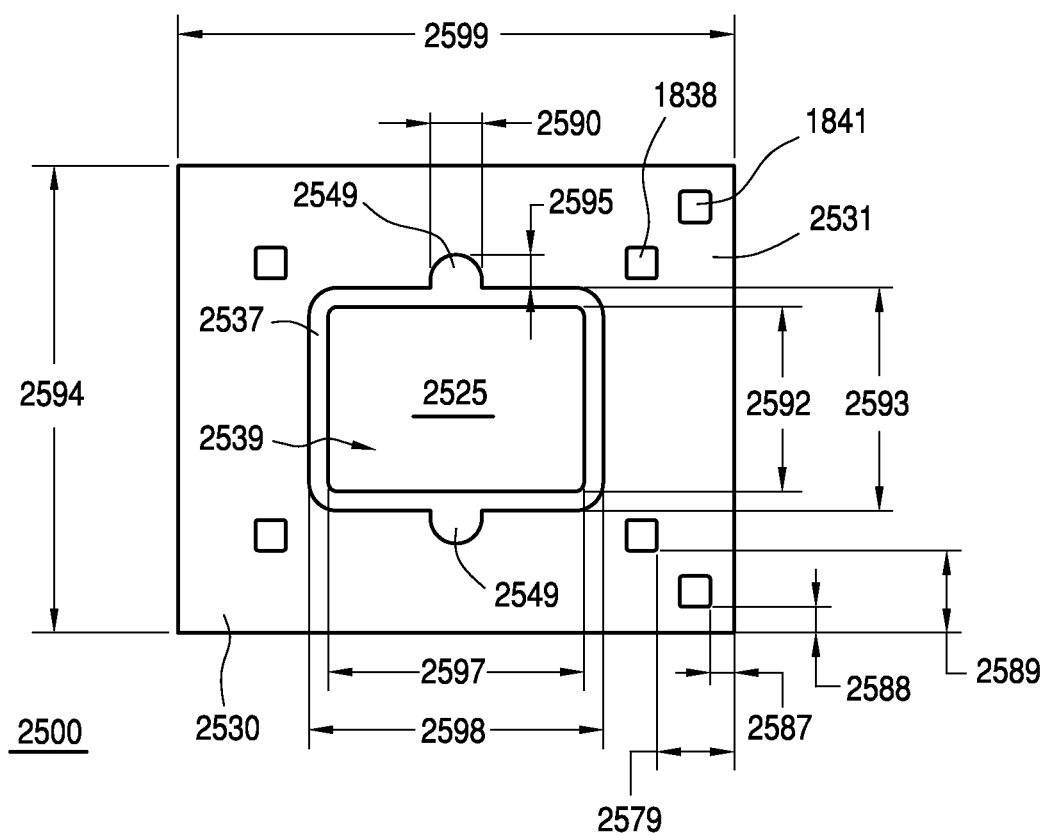
FIG. 25 illustrates a top view of a base of a semiconductor package, according to a fourth embodiment.
Figure 26:
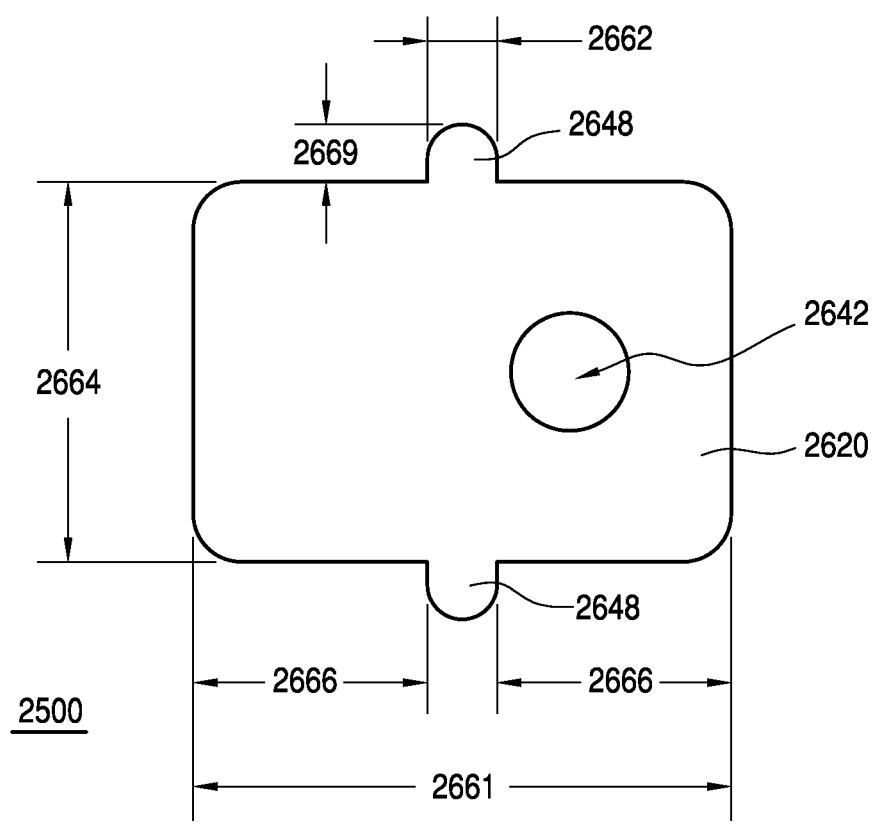
FIG. 26 illustrates a top view of an interposer of the semiconductor package of FIG. 25, according to the fourth embodiment.

Turning to yet another embodiment, FIG. 25 illustrates a top view of a base 2530 of a semiconductor package 2500, according to a fourth embodiment. FIG. 26 illustrates a top view of an interposer 2620 of semiconductor package 2500, according to the fourth embodiment. Semiconductor package 2500 is merely exemplary and is not limited to the embodiments presented herein. Semiconductor package 2500 can be employed in many different embodiments or examples not specifically depicted or described herein.

In some embodiments, an air cavity packaging or semiconductor package 2500 can be configured to electrically couple to a printed circuit board (PCB) (not shown). Semiconductor package 2500 can include: (a) a lid (not shown); (b) a base 2530 with a back chamber (not shown) and coupled to the lid; (c) an interposer 2620 (FIG. 26); (d) at least one micro-electro-mechanical system (MEMS) device (not shown); (d) at least one electrical component (not shown); and (e) one or more wires (not shown).

In some examples, base 2530 can include: (a) leadframe (not shown); and (b) non-electrically conductive material 2531. In some examples, non-electrically conductive material can have a cavity 2539 with a bottom 2525 and a shelf 2537. Shelf 2537 can be configured such that interposer 2620 (FIG. 26) can rest and be coupled to shelf 2537. When interposer 2620 is coupled to shelf 2537, non-electrically conductive material 2531 and interposer 2620 form a back chamber there between.

Referring to FIG. 25, in one example, the front half of base 2530 can be symmetric with the back half of base 2530. Similarly, with the exception of mounting pads 1841, the left half of base 2530 can be symmetric with the right half of base 2530. In the same or different example, base 2530 can have a length 2594 of approximately 3.76 mm, a width 2599 of approximately 4.72 mm, and a thickness of approximately 0.40 mm.

As shown in FIG. 25, mounting pads 1841 can have a diameter of approximately 0.25 mm and be offset from the side edge of base 2530 by a distance 2587 of approximately 0.20 mm and offset from the front or back edge of base 2530 by a distance 2588 of approximately 0.20 mm. Similarly, mounting pads 1838 can have a diameter of approximately 0.25 mm and be offset from the side edge of base 2530 by a distance 2579 of approximately 0.65 mm and offset from the front or back edge of base 2530 by a distance 2589 of approximately 0.65 mm.

Cavity 2539 can have a depth of approximately 0.20 mm and shelf 2537 can have a depth of approximately 0.10 mm. Cavity 2539 including shelf 2537 (without cutouts 2549) can have a maximum outer width 2598 of approximately 2.50 mm and a maximum outer length 2593 of approximately 1.80 mm. Cavity 2539 without shelf 2537 can have a maximum outer width 2597 of approximately 2.20 mm and a maximum outer length 2592 of approximately 1.50 mm. Cutouts 2549 can have a length 2590 of approximately 0.45 mm and a width 2595 of approximately 0.25 mm.

Figure 27:
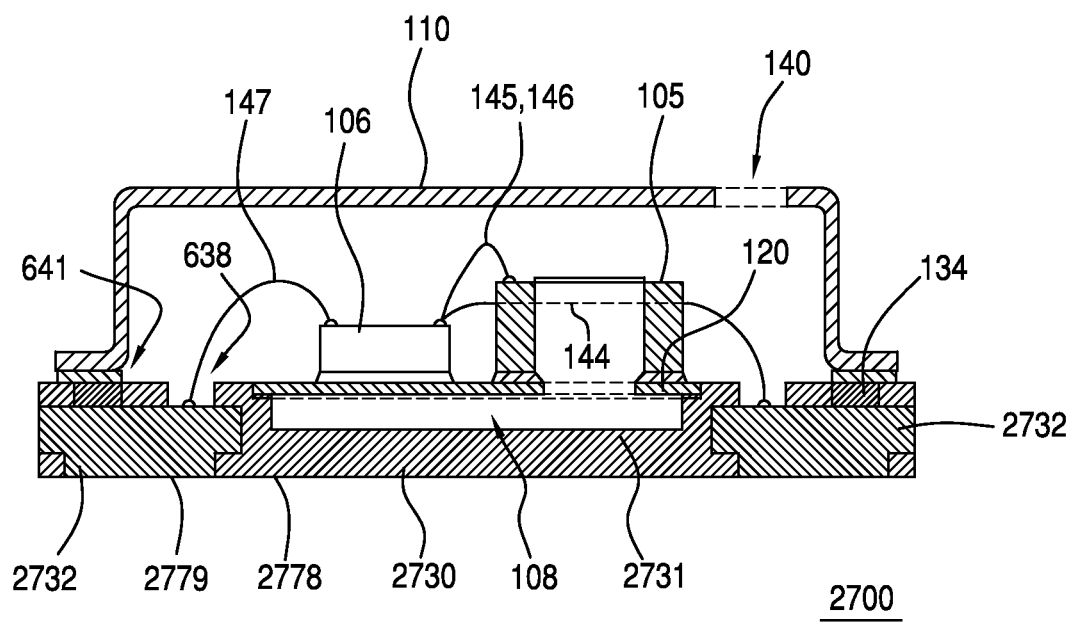
FIG. 27 illustrates a cross-sectional view of an example of a semiconductor package, according to a fifth embodiment.

Referring to FIG. 26, interposer 2620 can have an aperture 2642 and wire bonding regions 2648. Interposer 2460 can have thickness of approximately 0.08 mm and a maximum outer width 2661 of approximately 2.35 mm and a maximum outer length 2664 of approximately 1.65 mm. Aperture 2642 can have a diameter of approximately 0.50 mm. Wire bonding regions 2648 can have a width 2662 of approximately 0.30 mm and a length 2669 of approximately 0.25 mm. Wire bonding regions 2648 can be offset from the left and right sides of interposer 2620 by a distance 2666 of approximately 1.03 mm Turning to yet another embodiment, FIG. 27 illustrates a cross-sectional view of an example of a semiconductor package 2700, according to a fifth embodiment. Semiconductor package 2700 is merely exemplary and is not limited to the embodiments presented herein. Semiconductor package 2700 can be employed in many different embodiments or examples not specifically depicted or described herein.

In some embodiments, an air cavity package or semiconductor package 2700 can be configured to electrically couple to a printed circuit board (PCB) (not shown). Semiconductor package 2700 can include: (a) a lid 110; (b) a base 2730; (c) an interposer 120; (d) at least one MEMS device 105; (d) at least one electrical component 106; and (e) one or more wires 144, 145, 146, 147. Interposer 120 can be a separate or non-integrally formed element from base 2730.

In some examples, base 2730 can include: (a) leadframe 2732; (b) non-electrically conductive material 2731 with apertures 638 and 641; and (c) mounting pads 134 located at least partially in apertures 641. In this embodiment, a bottom 2779 of leadframe 2732 is substantial even or planar with a bottom 2778 of non-electrically conductive material 2731. In this example, mounting pad 133 (FIG. 1) is unnecessary. Leadframe 2732 can be couple semiconductor package 100 to a PCB (not shown) by, for example, surface mount adhesive techniques (SMT), solder balls, or flip chip techniques.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that activity 451-465 of FIG. 4 may be comprised of many different activities, procedures and be performed by many different modules, in many different orders and that the foregoing discussion of certain of these embodiments does not necessarily represent a complete description of all possible embodiments. As another example, a feature described to have a diameter may or may not be a circle.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A semiconductor package comprising:
    a base having a cavity;
    an interposer coupled to the base and at least partially over the cavity such that the interposer and the base form a back chamber, the interposer has a first opening into the back chamber;
    a micro-electro-mechanical system device located over the interposer and the first opening; and
    a lid coupled to the base.

2. The semiconductor package of claim 1, wherein:
    the base comprises:
        a leadframe; and
        a non-electrically conductive material covering a portion of the leadframe.

3. The semiconductor package of claim 2, wherein:
    the leadframe comprises:
        one or more electrical leads; and
    the interposer is electrically coupled to at least a first one of the one or more electrical leads.

4. The semiconductor package of claim 3, wherein:
    the at least the first one of the one or more electrical leads is configured to be electrically coupled to ground.

5. The semiconductor package of claim 3, further comprising:
    at least one wire,
    wherein:
        the at least one wire electrically couples the interposer to the at least the first one of the one or more electrical leads.

6. The semiconductor package of claim 2, wherein:
    the interposer is mechanically coupled to the non-electrically conductive material.

7. The semiconductor package of claim 2, wherein:
    the cavity is located in the non-electrically conductive material;
    the cavity has a bottom and a shelf; and
    the interposer is mechanically coupled to the shelf.

8. The semiconductor package of claim 7, wherein:
    the bottom of the cavity has a first height from a bottom of the base;
    the shelf has a second height from the bottom of the base;
    a top surface of the base has a third height from the bottom of the base;
    the third height is greater than the second height; and
    the second height is greater than the first height.

9. The semiconductor package of claim 8, wherein:
    the interposer has a first thickness; and
    the first thickness is less than or equal to a difference between the second height and the third height.

10. The semiconductor package of claim 2, wherein:
    the leadframe comprises:
        one or more electrical leads; and
        a shelf portion electrically coupled to a first lead of the one or more electrical leads; and
    the interposer is electrically and mechanically coupled to the shelf portion of the leadframe.

11. The semiconductor package of claim 1, wherein:
    the interposer comprises one of a stainless steel, a copper alloy, a plastic, or a printed circuit board.

12. An air cavity package comprising:
    a substrate comprising:
        a leadframe with one or more leads; and
        a plastic material with a cavity and at least partially surrounding the one or more leads;
    a metal interposer with a first opening and coupled to the substrate such that the metal interposer provides a top for the cavity and such that the metal interposer and the plastic material form a first interior space;
    a micro-electro-mechanical system microphone at least partially located over the first opening in the metal interposer;
    one or more semiconductor devices located over the metal interposer; and
    a lid electrically coupled to a first one of the one or more leads and mechanically coupled to the substrate.

13. The air cavity package of claim 12, wherein:
the metal interposer is electrically coupled to at least one of the micro-electro-mechanical system microphone or the one or more semiconductor devices.

14. The air cavity package of claim 13, wherein:
the metal interposer is configured to be electrically coupled to ground.

15. The air cavity package of claim 13, further comprising:
one or more wires,
wherein:
the metal interposer is electrically coupled to the one or more leads using the one or more wires.

16. The air cavity package of claim 12, wherein:
the plastic material comprises a shelf in the cavity; and
the metal interposer is mechanically coupled to the shelf.

17. The air cavity package of claim 12, wherein:
the plastic material comprises a liquid crystal polymer plastic.

18. The air cavity package of claim 12, wherein:
the metal interposer comprises a stainless steel or a copper alloy.

19. A method of manufacturing a semiconductor package, the method comprising:
providing a leadframe;
providing a non-electrically conductive material around the leadframe to form a base;
providing an interposer with an opening;
coupling the interposer to the base such that the interposer and the base form a back chamber;
providing at least one micro-electro-mechanical system device; and
coupling the at least one micro-electro-mechanical system device to the interposer at least partially over the opening.

20. The method of claim 19, wherein:
providing the non-electrically conductive material around the leadframe comprises:
injection molding a plastic material around the leadframe,
wherein:
the non-electrically conductive material comprises the plastic material.

21. The method of claim 19, wherein:
the non-electrically conductive material has a cavity; and
coupling the interposer to the base comprises:
coupling the interposer over the cavity in the non-electrically conductive material to enclose the cavity and form the back chamber.

22. The method of claim 19, wherein:
providing the interposer comprises:
providing the interposer to comprise metal.

23. The method of claim 19, further comprising:
providing at least one semiconductor component; and
mechanically coupling the at least one semiconductor component to the interposer.

24. The method of claim 23, further comprising:
wire bonding the at least one semiconductor device to the interposer.

25. The method of claim 23, further comprising:
wire bonding the at least one micro-electro-mechanical system device to the at least one semiconductor component.

26. The method of claim 19, further comprising:
wire bonding the interposer to the leadframe.

27. The method of claim 19, further comprising:
electrically coupling the interposer to the leadframe using a conductive adhesive.

28. The method of claim 19, further comprising:
providing a lid; and
mechanically coupling the lid to the base.

* * * * *